United States Patent [19]
Goodman

[11] 3,932,932
[45] Jan. 20, 1976

[54] METHOD OF MAKING MULTILAYER PRINTED CIRCUIT BOARD

[75] Inventor: David S. Goodman, Orange, Calif.

[73] Assignee: International Telephone and Telegraph Corporation, New York, N.Y.

[22] Filed: Sept. 16, 1974

[21] Appl. No.: 506,058

[52] U.S. Cl................ 29/625; 174/68.5; 317/101 B
[51] Int. Cl.² .......................................... H05K 3/00
[58] Field of Search..................... 29/624, 625, 628; 174/68.5; 317/101 B, 101 C, 101 CE, 101 CM; 339/17 R, 17 B, 17 C; 156/250, 252, 253

[56] References Cited
UNITED STATES PATENTS

| | | |
|---|---|---|
| 3,563,819 | 2/1971 | Rheingold et al.................. 29/625 X |
| 3,617,613 | 11/1971 | Benzinger et al.................. 174/68.5 |
| 3,691,632 | 9/1972 | Smith............................. 174/68.5 X |
| 3,719,536 | 3/1973 | Rheingold et al................ 29/625 X |
| 3,739,469 | 6/1973 | Dougherty, Jr................. 174/68.5 X |

Primary Examiner—C. W. Lanham
Assistant Examiner—Joseph A. Walkowski
Attorney, Agent, or Firm—T. L. Peterson

[57] ABSTRACT

A method of making a multilayer board in which relatively thick ground and voltage planes are punched to form clearance holes. The planes are stacked with insulative layers, laminated and then drilled to produce through holes aligned with the clearance holes. The through holes are then plated-through. The method eliminates under-etch problems in thick ground and voltage planes which are capable of carrying high magnitudes of current.

7 Claims, 4 Drawing Figures

METHOD OF MAKING MULTILAYER PRINTED CIRCUIT BOARD

BACKGROUND OF THE INVENTION

This invention relates generally to a method of manufacture of multilayer printed circuit boards and, more particularly, to the manner in which the ground and voltage planes are formed in such method.

Multilayer printed circuit boards, and various methods of their manufacture, are well known in the electronics industry. Typically, each layer of the printed circuit board consists of an insulative material with a foil (such as copper) on its upper and lower surfaces. A process including the steps of printing and etching may be used to produce a configuration of printed circuit wiring on each side of the layer. Alternatively, a masking and plating process can be used to deposit the printed circuit wiring on the insulative layer. The various layers are then bonded together to form a multilayer printed circuit board by first coating each layer with a prepreg (usually a B-stage epoxy), aligning and stacking the layers, and subjecting the layers to conditions of temperature and pressure which result in the formation of a permanent bond between the prepreg and the various layers. After this lamination process, through holes may be made and subsequently plated.

It is often desirable to provide voltage and ground planes in a multilayer printed circuit board. These planes consist of intermediate metal foils or layers within the multilayer structure. Such layers are typically 2 oz. copper (0.0028 inch), the same thickness as the printed circuit wiring on the various layers of the multilayer board. It is necessary to form clearance holes in the areas of the ground and voltage planes where it is not desired to have a connection between the planes and the plated-through holes. The clearance holes are substantially larger than the plated-through holes to assure that there is no undesirable electrical contact made between the platedthrough hole and the ground or voltage plane. With typical 2 oz. ground and voltage planes in a multilayer board, it is normally the practice to form the clearance holes by etching. For thin metal layers, etching has normally been an acceptable technique for providing an effective clearance area preventing short circuits in the board from the plated-through hole to the clearance hole in the ground or voltage planes.

Recently a demand has arisen for multilayer printed circuit boards capable of distributing high currents, such as 300–400 amps. The typical 2 oz. ground and voltage planes utilized in standard multilayer boards are inadequate for carrying such magnitudes of current. As a consequence, it has become necessary to increase the thickness of the ground and voltage planes. Increasing the thickness of these planes presents a serious problem in the forming of the clearance holes by etching techniques because of under-etched conditions that are created. That is, etching of relatively thick ground and voltage planes to form clearance holes is not reliable for eliminating the problem of undesired electrical contact between the planes and the plated-through holes.

It is the object of the invention to overcome the limitations in present technique of manufacturing multilayer printed circuit boards having relatively thick ground and voltage planes by providing a method which not only eliminates under-etch problems but also is relatively simple and inexpensive to perform.

SUMMARY OF THE INVENTION

According to the principal aspect of the present invention, there is provided a method of producing a multilayer printed circuit board having relatively thick ground and voltage planes suitable for carrying high magnitudes of current. Rather than utilizing metal foils or coatings on insulative sheets as the ground and voltage planes, as in prior art multilayer board assemblies, in accordance with the present invention relatively thicker metal sheets are utilized in which the clearance holes are formed by punching a plurality of the holes simultaneously. The clearance holes are then filled with an insulative material, such as epoxy prepreg. The ground and voltage metal sheets are stacked with an insulative inner layer therebetween and insulative outer layers on the top and bottom, with selected clearance holes in the metal sheets misaligned. The stack of sheets and insulative layers are then laminated to provide a unitary multilayer board assembly. Holes are then drilled through the stack coaxial with the clearance holes in each of the sheets. These holes have a diameter less than that of the clearance holes. Thereafter, a conductive material is applied to the walls of the through holes to provide plated-through holes. Each plated-through hole passing through a misaligned clearance hole will be electrically connected to one of the metal sheets and electrically isolated from the other sheet. The punching of the clearance holes in the metal sheets may be performed substantially more rapidly than drilling and entirely avoids the problem of under-etching as occurs when relatively thick metal layers are etched to form clearance holes. The method is therefore not only simple and inexpensive to perform, but results in a multilayer printed circuit board which can carry higher currents than multilayer boards produced by conventional techniques.

DESCRIPTION OF THE PREFERRED EMBODIMENT

The ground and voltage planes which are utilized in the method of manufacture of the multilayer printed circuit board in accordance with the present invention are metal sheets (such as copper) which are sufficiently thick to carry current of relatively high magnitudes, on the order of 200 amps or greater. The sheets are substantially thicker than the 2 oz. printed traces normally utilized on printed circuit boards. By way of example, the metal sheets may be five times thicker than the metallic traces, or greater. Generally speaking, the ground and voltage planes are self-supporting sheets, to be distinguished from metallic foils or traces which are simply coatings on insulative substrates as in prior art multilayer printed circuit board assemblies.

Figure 1:
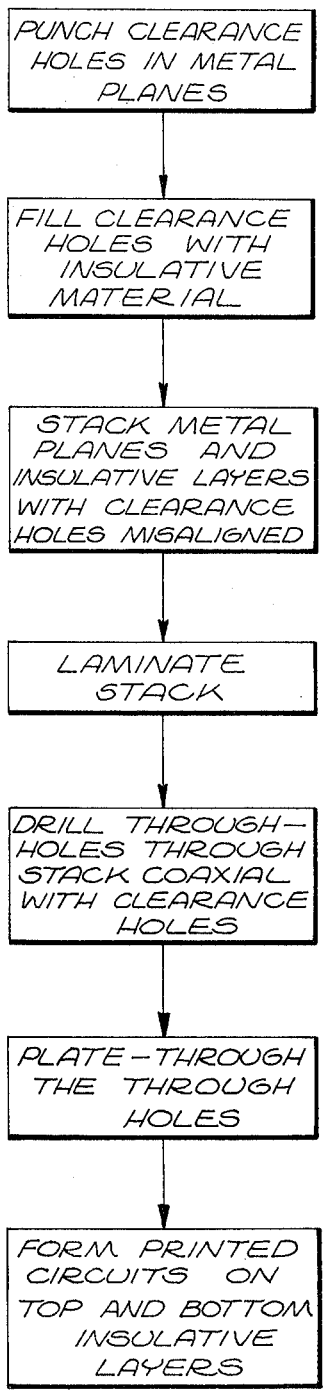
FIG. 1 is a flow chart illustrating the various steps performed in the method of the present invention.
Figure 2:
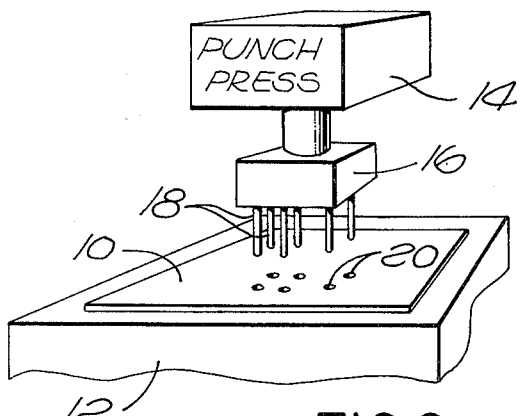
FIG. 2 is a somewhat schematic perspective view of a punch press utilized for punching clearance holes in the metal planes in accordance with the method of the present invention.
Figure 4:
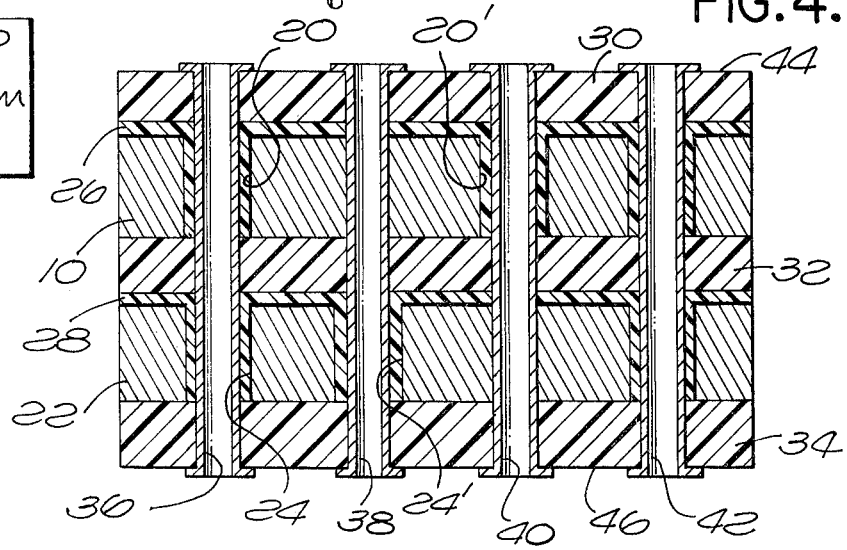
FIG. 4 is a vertical sectional view taken along line 4-4 of FIG. 3, with the contacts in the board being removed and the board being illustrated on a greatly enlarged scale for the purposes of clarity.

One of such metallic sheets is illustrated in FIG. 2, designated 10. The sheet is mounted on a support 12 below a punch press 14. The head 16 of the press carries a plurality of punches 18 arranged in a predetermined pattern. The diameters of the punches 18 are sufficient to provide clearance holes in the multilayer board to be produced in accordance with the invention. Upon actuation of the press 14, the head 16 lowers to simultaneously punch a plurality of clearance holes 20 in the sheet 10 in a predetermined pattern. The pattern is determined by the position in the final multilayer board where it is desired to to have plated-through holes. A second metal sheet, designated 22 in FIG. 4 is punched to simultaneously form a plurality of clearance holes 24 which is in a pattern different from the holes 20 in the first sheet 10. The pattern of holes in the two sheets are such that some of the holes in one of the sheets are misaligned with some of the holes in the other sheet, and the remaining holes are aligned when the two sheets are superposed over each other.

The number of holes which are simultaneously punched in the sheets 10 and 22 will be determined by the size of the punch press 14 and the number of punches it can carry. Normally, the number of punches which can be carried by the head 16 is not sufficient to punch all the holes which are required to be formed in the metal sheets. By way of example only, the punch head may carry from 20 to 150 punches depending on center line spacing. Obviously the punching of the holes in the sheets is substantially faster and more efficient than drilling holes.

A prepreg is then applied on one of the planar surfaces of each of the two sheets 10 and 22 to provide an insulative layer on the sheets and to fill the clearance holes in the sheets with insulative material. The insulative layers are indicated at 26 and 28 in FIG. 4.

The two metal sheets 10 and 22 and three insulative layers 30, 32 and 34 are then stacked together with the insulative layer 32 interposed between the two metal sheets, and the insulative layers 30 and 34 disposed on the outsides of the two sheets. Various thickness insulation layers may be used to control capacitance between layers. Obviously more than two metal sheets could be used if desired, with insulation layers therebetween.

As seen in FIG. 4, two sets of holes 20 and 24 in the sheets 10 and 22, respectively, are aligned when the metal sheets and insulative layers are stacked together, and the hole 20' in the sheet 10 is out of alignment with the hole 24' in the sheet 22. The purpose of this arrangement will become more apparent later.

The stack of metal sheets and insulative layers are then laminated together into a unitary assembly by the application of suitable temperature and pressure as well known to those skilled in the art and require no detailed description herein. Reference may be made to the article by W. S. Rigling, "Designing and Mating Multilayer Printed Circuits," Electro-Technology, May 1966, pgs. 54–57, and U.S. Pat. No. 3,739,469 for a more complete disclosure of the materials and techniques which may be utilized to manufacture the multilayer printed circuit board.

Following the lamination procedure, holes are drilled vertically through the multilayer board coaxial with the clearance holes in the two metal sheets. The through holes have a diameter less than the clearance holes in the metal sheets as is well known in the art. The through holes are then plated through with a conductive material, providing a series of plated-through holes designated 36, 38, 40 and 42 in FIG. 4. It is noted that the plated-through hole 36 is isolated from the metal sheets 10 and 22 by the insulative material filling the clearance holes 20 and 24. The plated-through hole 42 is likewise electrically isolated from the sheets 10 and 22. On the other hand, the plated-through hole 38 is electrically connected to the sheet 10 but is isolated from the sheet 22 by the insulation filling the clearance hole 24'. On the other hand, the plated-through hole 40 is electrically connected to the sheet 22 and isolated from the sheet 10. Therefore, the plated-through holes 38 and 40 permit electrical connection to the metal sheets or planes 10 and 22, respectively, while the plated-through holes 36 and 42 are isolated from the planes.

After the laminating step and the forming of the plated-through holes in the resultant multilayer board, printed circuitry is formed on the exposed upper surface 44 of the top insulative layer 30 and on the lower surface 46 of the lower insulative layer 34. A process including the steps of printing and etching may be used to produce the printed circuit wiring on the two layers. Alternatively, a masking and plating process could be used to deposit the printed circuit wiring on the insulators. Specific traces of printed circuit wiring on the upper surface 44 of the insulative layer 30 are indicated at 48, 50 and 52. The trace 50 connects to the plated-through hole 36. The trace 48 connects to a plated-through hole 36' behind the hole 36. The trace 52 connects to the plated-through hole 42. One or more traces may be provided on the lower surface 46 of the multilayer board. One such trace 55 joins to the lower end of the plated-through hole 42. Thus, the plated-through hole 42 jumps or interconnects the traces 52 and 55. Normally no traces connect to the plated-through holes 38 and 40 which are connected to the ground and voltage planes (sheets 10, 22). However, in some cases it may be desirable to connect a trace of the printed circuit wiring directly to one of the plated-through holes 38 and 40. Such a trace is indicated at 56 in FIG. 3.

Figure 3:
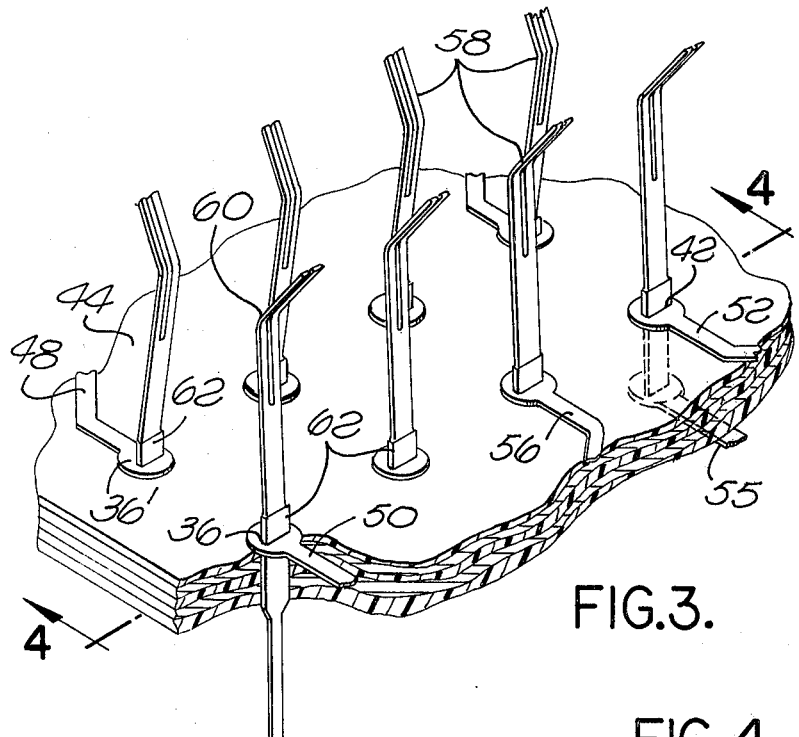
FIG. 3 is a fragmentary perspective view of a multilayer printed circuit board constructed in accordance with the method of the present invention, with contacts being shown mounted in the plated-through holes in the board.

FIG. 3 also illustrates a plurality of printed circuit board contacts 58 which are mounted into the plated-through holes in the multilayer board. These contacts may be either press fit into the holes, as illustrated, or may be soldered or staked into the holes. It is noted that the holes illustrated in FIG. 3 are disposed in two rows with the contacts in the holes in the respective rows aligned with each other. The contacts are mounted in these two rows of holes with their bowed contacting portions 60 facing each other. A printed circuit board connector housing, not shown, may be mounted over these contacts and retained on the multilayer board by frictional engagement with shoulders 62 on the contacts. The particular form of the contacts and the connector housing constitutes no part of the present invention. The contacts and connector housing may be constructed, for example, in the manner disclosed in U.S. Pat. No. 3,737,838.

Either one of sheets 10 or 22 may constitute the ground plane, while the other constitutes the voltage plane of the multilayer board. The number of plated-through holes 38 and 40 having connections to the respective voltage and ground planes is dependent upon the interconnection requirements between the printed circuit board, not shown, which engages the contacts 58 and the traces on the multilayer board. Typically only one ground plane is required for each printed circuit board. However one or more voltage planes may be required, and the remaining plated-through holes associated with the connector are utilized for making interconnections between the printed circuit traces on the multilayer board and signal traces on the PC board. Thus, the pattern of clearance holes stamped into the planes 10 and 22 is dependent upon the electrical interconnections to be made between the multilayer board (the mother board) and the daughter board mounted in the connector housing overlaying the contacts 58.

By way of example only, the ground and voltage planes may be between about 0.015 and 0.030-inch thick and the insulative layers 30, 32 and 34 may be about 0.010-inch thick. The traces on the upper and lower surfaces of the multilayer board are typically 1 oz. to 2 oz. copper.

It will be appreciated from the foregoing that by punching the clearance holes in relatively heavy metal planes in accordance with the present invention, large currents can be carried by the multilayer board without the problem of short circuiting occurring as the result of under etching which would otherwise occur if etching processes were utilized to form the clearance holes. The punching operation to form a large number of clearance holes is also rapid and easily performed and thus is economical for the manufacture of multilayer boards.

What is claimed is:

1. A method of making a multilayer printed circuit board comprising the steps of:
   providing at least two individual metal sheets of a thickness which, if etched, would have an under-etch condition;
   simultaneously punching a plurality of clearance holes in one of said sheets in a first predetermined pattern;
   simultaneously punching a plurality of clearance holes in the other of said sheets in a second predetermined pattern;
   filling said clearance holes with an insulative material;
   stacking said sheets with an insulative inner layer therebetween and insulative outer layers on the top and bottom thereof with at least some of the clearance holes in the respective sheets misaligned;
   laminating said stack of sheets and layers together to provide a unitary assembly;
   drilling holes vertically through said stack coaxial with the clearance holes in each of said sheets, said through holes having a diameter less than that of said clearance holes; and
   plating through said through holes with a conductive material.

2. A method as set forth in claim 1 wherein:
   said metal sheets are self-supporting.

3. A method as set forth in claim 1 wherein:
   each said metal sheet has a thickness of about 0.015 inch or greater.

4. A method as set forth in claim 1 wherein:
   said second predetermined pattern of clearance holes is different from said first predetermined pattern; and
   wherein said sheets and layers are stacked so that some of the clearance holes in the respective sheets are aligned.

5. A method as set forth in claim 4 including the additional step of:
   forming metallic traces on the exposed planar surface of at least one of said outer insulative layers, with said traces connecting to said plated through holes passing through said aligned clearance holes.

6. A method as set forth in claim 5 wherein:
   each said metal sheet is at least about 5 times thicker than said metallic traces.

7. A method as set forth in claim 1 wherein:
   said clearance holes in said sheets are filled with an insulative material by coating the surface of said sheets with a prepreg prior to stacking said sheet and insulative layers.

* * * * *